US012604588B2

(12) United States Patent
Wang et al.

(10) Patent No.: US 12,604,588 B2
(45) Date of Patent: Apr. 14, 2026

(54) LIGHT EMITTING ASSEMBLY AND METHOD OF TRANSFER PRINTING A MICRO-LED

(71) Applicant: XIAMEN SAN'AN OPTOELECTRONICS CO., LTD., Xiamen (CN)

(72) Inventors: Yenchin Wang, Tianjin (CN); Jinghua Chen, Tianjin (CN); Huan-Shao Kuo, Tianjin (CN); Shuiqing Li, Xiamen (CN); Shaohua Huang, Xiamen (CN); Yu-Ren Peng, Tianjin (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 453 days.

(21) Appl. No.: 18/156,623

(22) Filed: Jan. 19, 2023

(65) Prior Publication Data

US 2023/0155071 A1     May 18, 2023

Related U.S. Application Data

(63) Continuation-in-part of application No. PCT/CN2021/083621, filed on Mar. 29, 2021.

(51) Int. Cl.
*H10H 20/80*          (2025.01)
*H10H 20/01*          (2025.01)
*H10H 20/824*         (2025.01)

(52) U.S. Cl.
CPC ........ *H10H 20/862* (2025.01); *H10H 20/018* (2025.01); *H10H 20/013* (2025.01); *H10H 20/034* (2025.01); *H10H 20/8242* (2025.01)

(58) Field of Classification Search
None
See application file for complete search history.

(56) References Cited

U.S. PATENT DOCUMENTS

2007/0045609 A1*   3/2007   Saxler .................. H10H 20/813
                                                              257/14
2011/0248237 A1*   10/2011   Choi .................... H10H 20/857
                                                              257/13

(Continued)

FOREIGN PATENT DOCUMENTS

CN          109103315 A      12/2018

OTHER PUBLICATIONS

Search Report issued to PCT application No. PCT/CN2021/083621 on Dec. 29, 2021.

*Primary Examiner* — Bilkis Jahan
(74) *Attorney, Agent, or Firm* — Thomas | Horstemeyer, LLP

(57) ABSTRACT

A light emitting assembly includes a micro-LED, and a supporting substrate. The micro-LED includes a semiconductor structure and a first insulating dielectric layer. The semiconductor structure includes a first-type semiconductor layer; second-type semiconductor layer, and has a first mesa surface defined by the first-type semiconductor layer, and a second mesa surface defined by the second-type semiconductor layer. The first insulating dielectric layer covers the first and second mesa surfaces and has a first mesa covering portion that covers the first mesa surface, and two bridging arms projecting from the first mesa covering portion. The two bridging arms are located on two opposite sides of the semiconductor structure and connect with the supporting substrate so that the micro-LED is supported by the supporting substrate. The two bridging arms have a thickness which is less than a thickness of the first mesa covering portion on the first mesa surface.

20 Claims, 8 Drawing Sheets

(56) References Cited

U.S. PATENT DOCUMENTS

| | | | |
|---|---|---|---|
| 2015/0155426 A1* | 6/2015 | Jeon | H10H 20/825 |
| | | | 438/29 |
| 2016/0111600 A1* | 4/2016 | Chae | H10H 20/831 |
| | | | 257/99 |
| 2017/0170364 A1* | 6/2017 | Jeon | H10H 20/841 |
| 2018/0138371 A1* | 5/2018 | Wu | H10H 20/01 |
| 2020/0381603 A1* | 12/2020 | Ting | H10H 20/856 |

* cited by examiner

LIGHT EMITTING ASSEMBLY AND METHOD OF TRANSFER PRINTING A MICRO-LED

CROSS-REFERENCE TO RELATED APPLICATION

This application is a continuation-in-part (CIP) of International Application No. PCT/CN 2021/083621, filed on Mar. 29, 2021.

FIELD

The disclosure relates to a light emitting assembly, and more particularly to a light emitting assembly and a method of transfer printing micro-LEDs.

BACKGROUND

Micro-light-emitting-diodes (LED) have the advantages of light emission, high efficiency, low power consumption, high brightness, high stability, ultra-high resolution and color saturation, fast response time, and longer lifetime, etc. Micro-LEDs have found applications in display technology, optical communication, indoor positioning technology, and biomedical fields, and are expected to further expand to multiple domains such as wearable/implantable devices, enhanced displays/virtual reality, in-vehicle displays, very large scale displays and optical communications/optical interconnects, medical probes, smart vehicle lamps, spatial imaging, etc., all with appreciable market potential.

A significant technical challenge of micro-LED fabrication is improving the yield of mass transfer printing of micro-LEDs.

Micro-LEDs prefabricated in arrays typically have bridging arms bonded to a support substrate. During transfer printing, bridging arms are caused to break and the micro LEDs are separated from the support substrate. However, in the prior art, when the micro-LEDs undergo mass transfer, a higher gripping force is required to transfer the micro-LEDs, and the positions where the bridging arms break are variable. These result in abnormal residual parts of the bridging arms remaining on the micro-LEDs which in turn affects the yield of the mass transfer.

SUMMARY

Therefore, an object of the disclosure is to provide a light emitting assembly, a micro-LED, and a method of manufacturing and transfer printing micro-LED to a semiconductor packaging board that can alleviate at least one of the drawbacks of the prior art.

According to one aspect of the disclosure, the light emitting assembly includes at least one micro-light-emitting-diode (LED) and a supporting substrate. The at least one micro-LED includes a semiconductor structure, a first electrode, a second electrode, and a first insulating dielectric layer. The semiconductor structure includes a first-type semiconductor layer, a second-type semiconductor layer, and an active layer located between the first-type semiconductor layer and the second-type semiconductor layer. The semiconductor structure has a first mesa surface defined by the first-type semiconductor layer, and a second mesa surface defined by the second-type semiconductor layer. The first electrode is formed on the first mesa surface and is electrically connected to the first-type semiconductor layer. The second electrode is formed on the second mesa surface and is electrically connected to the second-type semiconductor layer. The first insulating dielectric layer covers the first and second mesa surfaces of the semiconductor structure, and has a first mesa covering portion that covers the first mesa surface, and at least two bridging arms projecting from the first mesa covering portion. The at least one micro-LED is received within the supporting substrate. The at least two bridging arms are located on two opposite sides of the semiconductor structure, and connect between the semiconductor structure and the supporting substrate so that the at least one micro-LED is supported by the supporting substrate. The at least two bridging arms have a thickness which is less than a thickness of the first mesa covering portion of the first insulating dielectric layer on the first mesa surface.

According to another aspect of the disclosure, a micro-LED device includes a chip formed from the at least one micro-LED of the light-emitting assembly mentioned above by separating the at least one micro-LED from the supporting substrate of the light-emitting assembly mentioned above. A side wall of the chip has a residual part of at least one of the two bridging arms that is in a small quantity.

According to still another aspect of the disclosure, the method of manufacturing and transfer printing a micro-LED to a semiconductor packaging board includes the steps of:

(a) forming on a growth substrate a semiconductor stack including a first-type semiconductor layer, a second-type semiconductor layer, and an active layer located between the first-type semiconductor layer and the second-type semiconductor layer;

(b) removing partially the semiconductor stack to form an array of semiconductor structures each having a first mesa surface and a second mesa surface that are respectively defined by the first-type semiconductor layer and the second-type semiconductor layer, and forming a first electrode and a second electrode on the first mesa and the second mesa, respectively;

(c) forming a first insulating dielectric layer to over the first mesa surface and the second mesa surface of each of the semiconductor structures;

(d) covering the first insulating dielectric layer with a sacrificial layer, and bonding the sacrificial layer to a supporting substrate, wherein the sacrificial layer forms a bonding connection between each of the semiconductor structures and the supporting substrate;

(e) removing a whole of the growth substrate and part of the first-type semiconductor layer, wherein spacings are created between the semiconductor structures;

(f) etching away the sacrificial layer to remove the bonding connection between each of the semiconductor structures and the support substrate, followed by forming part of the first insulating dielectric layer into bridging arms such that each of the semiconductor structures has at least two of the bridging arms, wherein the bridging arms are shaped through a patterned photomask, the bridging arms are thinned using a dry etching process so that the two bridging arms have a thickness that is less than a thickness of a first mesa covering portion of the first insulating dielectric layer that covers the first me and the array of the ser semiconductor structures are formed into an array of separable independent micro LED chips;

(g) removing the micro-LED from the supporting substrate, and transfer printing the micro-LED to a packaging substrate.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
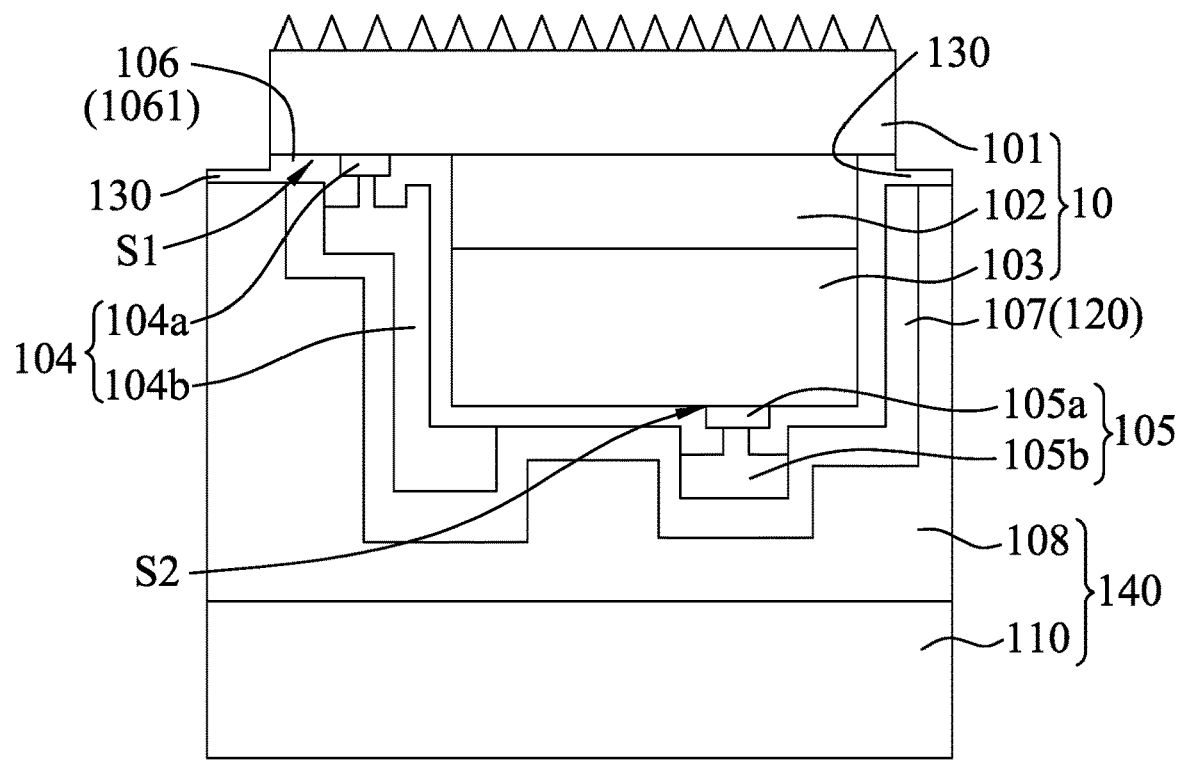
FIG. 1 is a schematic cross-sectional view showing a micro LED of a light emitting assembly according to an embodiment of the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIG. 1, a first embodiment of a light emitting assembly according to the present disclosure includes at least one micro-light-emitting diode (LED) and a supporting substrate 140. The micro-LED has a flip chip structure, and the term "micro" refers to the LED having micro-scale dimensions. More specifically, the micro-LED has a length dimension, a width dimension, and a height dimension, and the length, width and height dimensions each range from 2 μm to 100 μm. Since the size of the micro-LEDs is small in comparison to conventional LEDs, the fabrication process is therefore largely different from that of a conventional light emitting diode.

In the first embodiment, the light-emitting assembly includes at least one micro-LED. However, other embodiments of the disclosure may include multiple micro-LEDs. The micro-LED includes a semiconductor structure 10, a first electrode 104, a second electrode 105, and a first insulating dielectric layer 106. The semiconductor structure 10 includes a first-type semiconductor layer 101, a second-type semiconductor layer 103, and an active layer 102. The semiconductor structure 10 has a first mesa surface (S1) and a second mesa surface (S2). The first mesa surface (S1) and the second mesa surface (S2) are located on the same side of the semiconductor structure 10. The first mesa surface (S1) is defined by the first-type semiconductor layer 101, and the second mesa surface (S2) is defined by the second-type semiconductor layer 102. The first-type semiconductor layer 101 and the second-type semiconductor layer 103 are respectively exposed at the first and second mesa surfaces (S1, S2).

The first-type semiconductor layer 101 may be a group III-V compound semiconductor or a group II-VI compound semiconductor, and may be doped with a first dopant. The first-type semiconductor layer 101 may be composed of a semiconductor material having the formula $In_{X1}Al_{Y1}Ga_{(1-X1-Y1)}N$ ($0 \leq X1 \leq 1, 0 \leq Y1 \leq 1, 0 \leq X1+Y1 \leq 1$), for example gallium nitride (GaN), aluminum gallium nitride (AlGaN), indium gallium nitride (inGaN), or indium gallium aluminum nitride (InGaAlN), etc., or a material selected from aluminum gallium arsenide (AlGaAs), gallium phosphide (GaP), gallium arsenide (GaAs), gallium arsenide phosphide (GaAsP), and aluminum gallium arsenide (AlGaAs). In addition, the first dopant may be an n-type dopant, such as silicon (Si), germanium (Ge), tin (Sn), selenium (Se), and tellurium (Te). When the first dopant is an n-type dopant, the first-type semiconductor layer 101 is an n-type semiconductor layer. However, in some embodiments, the first dopant may be a p-type dopant, such as magnesium (Mg), zinc (Zn), calcium (Ca), strontium (Sr), and barium (Ba); in which case, the first-type semiconductor layer 101 will be a p-type semiconductor layer. A surface of the first-type semiconductor layer 101 which is distal from the substrate 110 is a light-emitting surface. In order to enhance the light output efficiency of the micro-LED, a roughening treatment may be performed on the light-emitting surface to form a roughened structure. However, in other embodiments, the light-emitting surface of the first-type semiconductor layer 101 may not be roughened.

The active layer 102 is located between the first-type semiconductor layer 101 and the second-type semiconductor layer 103. The active layer 102 is where electrons recombine with electron holes to emit light, and may emit light of specific wavelengths according to the material used for the active layer 102. The active layer 102 may have a single quantum well structure or a periodic structure of multiple quantum wells, and may include one or more well layers and one or more barrier layers, wherein the barrier layer(s) has a larger band gap than the well layer(s). By adjusting the composition ratio of the active layer 102, light of different wavelengths may be emitted.

The second-type semiconductor layer 103 is formed above active layer 102, and may be composed of a group III-V or a group II-VI compound semiconductor. The second-type semiconductor layer 103 may be doped with a second dopant. The second-type semiconductor layer 103 may consist of a semiconductor material having the formula $In_{X2}Al_{Y2}Ga_{(1-X2-Y2)}N$ ($0 \leq X2 \leq 1, 0 \leq Y2 \leq 1, 0 \leq X2+Y2 \leq 1$), or a material selected from aluminum gallium arsenide (AlGaAs), gallium phosphide (GaP), gallium arsenide (GaAs), gallium arsenide phosphide (GaAsP), and aluminum gallium arsenide (AlGaAs). When the second dopant is a p-type dopant, such as magnesium (Mg), zinc (Zn), calcium (Ca), strontium (Sr), and barium (Ba), the second-type semiconductor layer 103 that is doped with the second dopant is a p-type semiconductor layer. In some embodiments, the second dopant may be an n-type dopant, such as silicon (Si), germanium (Ge), tin (Sn), selenium (Se), and tellurium (Te). When the second dopant is an n-type dopant, and the second-type semiconductor layer 103 is doped with the second dopant, the second-type semiconductor layer 103 will be an n-type semiconductor layer. In some embodiments where the first-type semiconductor layer 101 is an n-type semiconductor layer, the second-type semiconductor layer 103 will be the p-type semiconductor layer. Conversely, in embodiments where the first-type semiconductor layer 101 is the p-type semiconductor layer, the second-type semiconductor 103 will be the n-type semiconductor layer.

The semiconductor structure 10 may include other layers, such as a current spreading layer, a window layer, or an ohmic contact layer, etc. (not shown in the Figures), that may be included according to different doping concentrations or component content requirements of the micro-LED. The semiconductor structure 10 may be formed on the growth substrate 100 via physical vapor deposition (PVD), chemical vapor deposition (CVD), epitaxial growth technology, or atomic layer deposition (ALD), etc. In the present embodiment, the semiconductor structure 10 is composed of aluminum gallium indium phosphide (AlGaInP), and emits red light. However, the disclosure is not limited to red light emitting micro-LEDs, and may include blue or green light-emitting micro-LEDs. The first electrode 104 is formed on the first mesa surface (S1) and electrically connected to the first-type semiconductor layer 101, and the second electrode 105 is formed on the second mesa surface (S2) and electrically connected to the second-type semiconductor layer 103. In some embodiments, the first electrode 104 includes a first contact electrode 104a and a first bonding electrode 104b, and the second electrode 105 includes a second contact electrode 105a and a second bonding electrode 105b.

In some embodiments, the first contact electrode 104a is located on the first-type semiconductor layer 101 and forms an ohmic contact with the first-type semiconductor layer 101. The first bonding electrode 104b is located above the first contact electrode 104a and forms an electrical connection with the first contact electrode 104a through an opening of the first insulating dielectric layer 106. In some embodiments, the second contact electrode 105a is located on the second-type semiconductor layer 103, and forms ohmic contacts with the second-type semiconductor layer 103. The second bonding electrode 105b is located above the second contact electrode 105a and forms an electrical connection with the second contact electrode 105a through the opening of the first insulating dielectric layer 106.

The material of the first contact electrode 104a and the second contact electrode 105a may be formed from a single material or from a combination of two or more materials that form a laminated structure, such as Au/AuZn/Au. The first bonding electrode 104b and the second bonding electrode 105b may be made from a material such as gold (Au), silver (Ag), aluminum (Al), platinum (Pt), titanium (Ti) nickel (Ni), chromium (Cr) or a combination of the above. In some embodiments, the first bonding electrode 104b and the second bonding electrode 105b may be formed of a reflective metal such as gold (Au) or aluminum (Al), so as to improve light extraction efficiency and enhance the brightness of the micro-LED. In some embodiments, the first bonding electrode 104b extends over the second mesa S2, and top surfaces of the first bonding electrode 104b and the second bonding electrode 105b are flush with each other. The design of using the first bonding electrode 104b extending to the second mesa surface (S2) facilitates the packaging process, and increases packaging yield.

In order to improve the reliability of the micro-LED, the first mesa surface (S1), the second mesa surface (S2), and the sidewall of the micro-LED have the first insulating dielectric layer 106. The first insulating dielectric layer 106 covers the first and second mesa surfaces (S1, S2) of the semiconductor structure 10, and has a first mesa covering portion 1061 that covers the first mesa surface (S1). The first insulating dielectric layer 106 has at least two bridging arms 130 projecting from the first mesa covering portion 1061. In some embodiments, the first insulating dielectric layer 106 has only two bridging arms 130; however, in other embodiments, the first insulating dielectric layer 106 has three or more bridging arms 130. The at least two bridging arms 130 are formed on two opposite sides of the semiconductor structure 10, project from the first mesa covering portion 1061, and connect with the supporting substrate 140. In other words, the micro-LED is connected to the supporting substrate 140 via the bridging arm 130, and the micro-LED is received within the supporting substrate 140 and supported by the supporting substrate 140. The first insulating dielectric layer 106 may be a distributed Bragg reflector (DBR) made from alternating layers of two insulating dielectric materials with different refractive indices. For example the distributed Bragg reflector be made of non-metallic materials such as $SiO_2$, $SiN_x$, $TiO_2$, $Al_2O_3$. The distributed Bragg reflector may reflect light from the semiconductor structure towards the light emitting surface to thereby increase the luminous efficiency of the micro-LED. The first insulating dielectric layer 106 material has a thickness of 1 μm or greater, and more preferably, the thickness of the first insulating dielectric layer 106 on the first mesa surface (S1) ranges from 1.0 to 1.5 μm.

The supporting substrate 140 is located below the micro-LED, and receives the micro-LED. The supporting substrate 140 includes a base plate 110 and a bonding layer 108 that is located above the base plate 110, and the bridging arms 130 and the semiconductor structure 10 straddle the bonding layer 108. The supporting substrate 140 has a cavity 120 that receives the micro-LED. Specifically, the bonding layer 108 of the supporting substrate 140 has the cavity 120 to receive the micro-LED. The bonding layer 108 is made of a material that includes a benzocyclobutene (BCB) adhesive, silica gel, a UV activated adhesive, or an epoxy resin adhesive. The bridging arms 130 may be made of a material that includes $SiO_2$, $SiN_x$, $TiO_2$, $Al_2O_3$ or any combination of the above.

The micro-LED is separable from the supporting substrate 140 via micro-transfer printing. The transfer stamp used in transfer printing may be made of polydimethylsiloxane (PDMS), silica gel, thermal release tape, or UV activated adhesive. In some embodiments, the supporting substrate 140 has a sacrificial layer 107 disposed in the cavity 120 around the micro-LED. That is to say, the sacrificial layer 107 fills a spacing between the micro-LED and the boundary of the cavity 120. The sacrificial layer 107 is comparatively easier for removal than other layers of the micro-LED when a specific removal process is performed. The specific removal process may be a chemical separation process such as etching, or UV degradation, or a physical separation process such as a mechanical impact application process. The sacrificial layer 107 includes a material that includes an oxide, a nitride, titanium (Ti), titanium tungsten (TiW) or any combination of the above. Additionally, it should be noted that the sacrificial layer 107 has a thickness that is greater than 1 μm.

In order to solve the technical problems alluded to in the background, the at least two bridging arms 130 have a thickness which is less than a thickness of the first mesa covering, portion 1061 of the first insulating dielectric layer 106 on the first mesa surface (S1). In some embodiments, the thickness of the at least two bridging arms 130 ranges from 0.5 μm to 1.0 μm, and each of the at least two bridging arms 130 is 0.5 μm to 1.0 μm less than the thickness of the first mesa covering portion 1061 of the first insulating dielectric layer 106 on the first mesa surface (S1). Since the thickness of the bridging arm 130 is fess than the thickness of the first insulating dielectric layer 106 on the first mesa surface (S1), there is a structurally weak area that may develop into a breakpoint at the connection between the semiconductor structure 10 and the bridging arm 130. In this way, the bridging arm 130 may breakoff at an optimal position during mass transfer of the micro-LED, thereby enhancing the yield of the mass transfer.

The bridging arms 130 may be further refined and shaped through a patterned photomask. In this embodiment, each of the two bridging arms 130 has a horizontal cross-section that is parallel to a surface of the first mesa surface (S1), and that has a trapezoidal shape. In some embodiments, each of the two bridging arms 130 has a horizontal cross-section that is parallel to the first mesa surface (S1) that has an area gradually increasing from the first mesa covering portion 1061 on the first mesa surface (S1) in a direction away from the first mesa covering portion 1061. Additionally, the two bridging arms 130 have two sides (L1, L2) that are opposite to each other, and a ratio between lengths (d1, d2) of the two sides ranges from 1.5 to 3.

More specifically, each of the bridging arms 130 forms a junction with the first mesa covering portion 1061 of the first insulating dielectric layer 106 at a shorter one of two opposite sides of the trapezoid, and because of the trapezoidal shape of the bridging arms 130, at the junction between each of the bridging arms 130 and the first mesa covering portion 1061, the cross sectional area of each bridging arm 130 is minimized. This junction is a point where not only mechanical stress is concentrated, but also the point where the structural strength of each bridging arm is minimized. The position of the junction can control the position where each bridging arm 130 break off the micro-LED during the mass transfer process. By inducing the breakpoints to form at the shorter sides (L1) of the trapezoidal bridging arms 130, the problem of low mass transfer yield due to the prior art bridging arms having variable breakpoints is alleviated.

Figure 3:
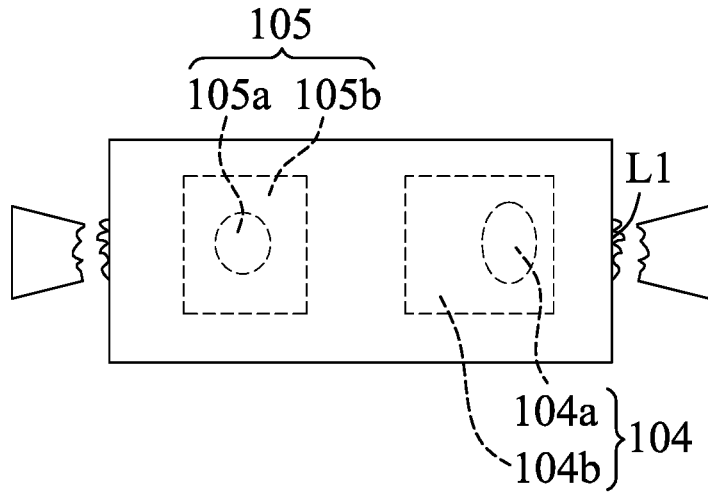
FIG. 3 is the same view as FIG. 2, but illustrating two bridging arms of the micro LED breaking off.
Figure 4:
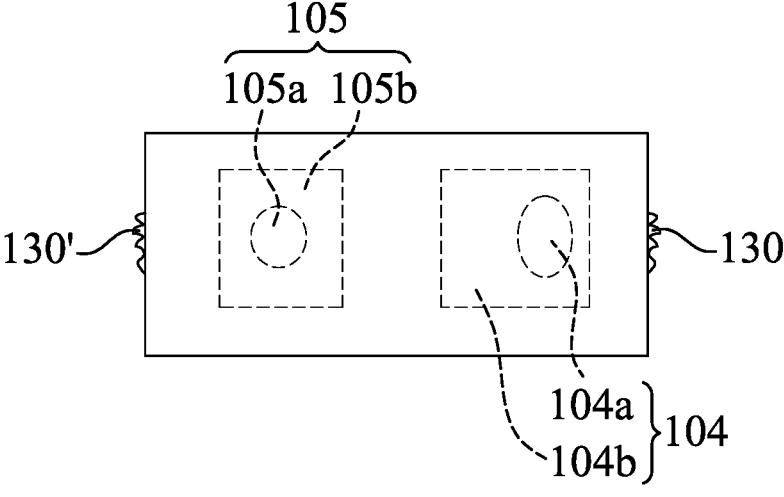
FIG. 4 is the same view as FIG. 3 but illustrating, the micro LED with residual parts of the two bridging arms after removal of the bridging arms.
Figure 5:
FIGS. 5 to 16 illustrate an embodiment of a method of transfer printing a micro-LED, the figures showing successive steps of the method.

Referring to FIG. 3, here the bridging arms 130 have been broken off at the shorter sides (L1) of the trapezoidal bridging arms 130 after mass transfer printing process. During the mass transfer process, a chip is formed from the at least one micro-LED of the light-emitting assembly by separating the at least one micro-LED from the supporting substrate 140 of the light-emitting assembly. Aside wall of the chip may have a residual part 130' of at least one of the two bridging arms 130 that is in a small quantity. In some embodiments, after mass transfer the small residual part 130' of each bridging arm 130 has a width that ranges from 0.5 μm to 1.0 μm. Referring to FIG. 4, the residual part 130' of each bridging arm 130 left on the micro LED chip is small and is serrated; however, this is not a limitation of the disclosure, and in other embodiments the residual part 130' may be other shapes.

FIGS. 5 to 16 successively show steps (a) to (g) in a method of manufacturing and transfer printing a micro-LED to a semiconductor packaging board. The following is a step by step detailed account of the above mentioned method:

In step (a) of the method, a semiconductor stack is formed on a growth substrate 100 to include a first-type semiconductor layer 101, a second-type semiconductor layer 103, and an active layer 102 located between the first-type semiconductor layer 101 and the second-type semiconductor layer 103.

Specifically, the growth substrate 100 is preferably a gallium arsenide (GaAs) substrate. The semiconductor structure 10 is grown on the growth substrate 100 via an epitaxial process such as metalorganic vapor-phase epitaxy (MOCVD) process. The semiconductor structure 10 includes a first-type semiconductor layer 101, a second-type semiconductor layer 103, and an active layer 102 located between the first-type semiconductor layer 101 and the second-type semiconductor layer 103. The first-type semiconductor layer 101, the active layer 102, and the second-type semiconductor layer 103 are successively stacked on the growth substrate 100. Preferably, the semiconductor structure 10 is made of an aluminum gallium indium phosphide (AlGaInP) material, and the active layer 102 emits red light.

Figure 6:
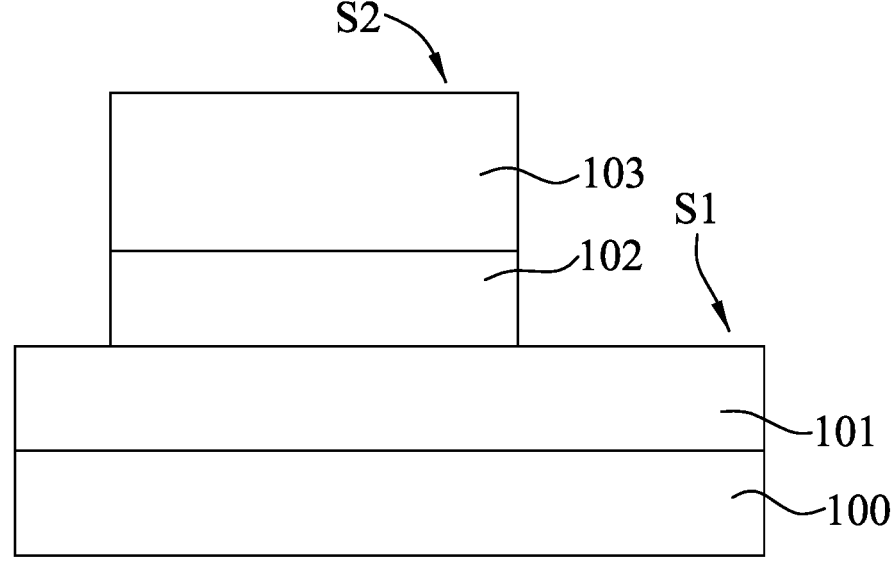

Referring to FIG. 6, in step (b), part of the semiconductor stack is removed to form an array of semiconductor structures (10) (only one semiconductor structure is shown in FIG. 6) each having a first mesa surface (S1) and a second mesa surface (S2) that are respectively defined by the first-type semiconductor layer 101 and the second-type semiconductor layer 103. A first electrode 104 and a second electrode 105 is formed on the first mesa surface (S1) and the second mesa surface (S2) respectively.

More specifically, the first mesa surface (S1) and the second mesa surface (S2) are formed by dry etching away a portion of the semiconductor structure 10, and exposing the first-type semiconductor layer 101 to form the first mesa surface (S1) and exposing the second-type semiconductor layer 103 to form the second mesa surface (S2). The first mesa surface (S1) and the second mesa surface (S2) are on the same side of the semiconductor structure 10, and the second mesa surface (S2) is located on a side of the second-type, semiconductor layer 103 away from the active layer 102, and is located above the first mesa surface (S1) (see FIG. 6).

Figure 7:
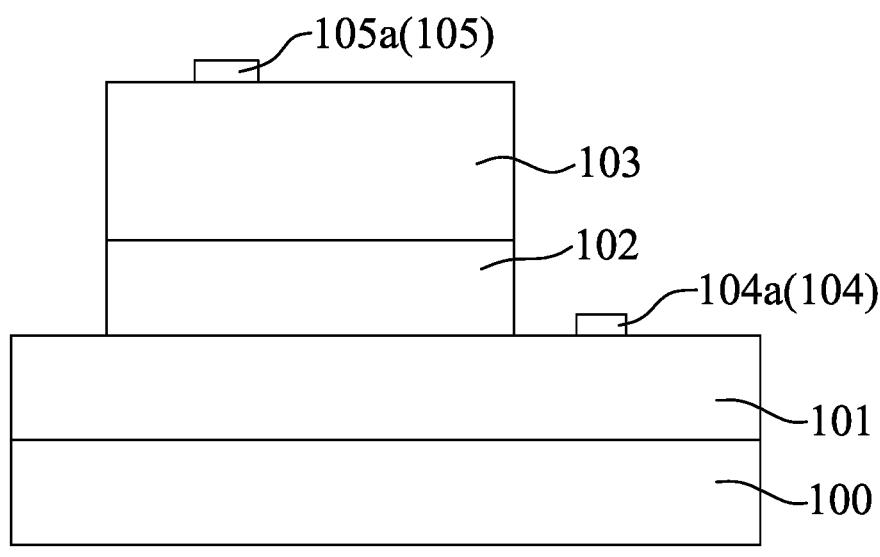

Referring to FIG. 7, a first contact electrode 104a of the first electrode 104, and a second contact electrode 105a of the second electrode 105 are respectively formed on the first mesa surface (S1) and the second mesa surface (S2), respectively. The first contact electrode 104a and the second contact electrode 105a respectively form ohmic contacts with the first-type semiconductor layer 101 and the second-type semiconductor layer 103. The first contact electrode 104a and the second contact electrode 105a may be a laminated structure such as Au/AuZn/Au. In this step, the first contact electrode 104a and the second contact electrode 105a may be fusion bonded to provide ohmic contact with the semiconductor structure 10.

Figure 8:
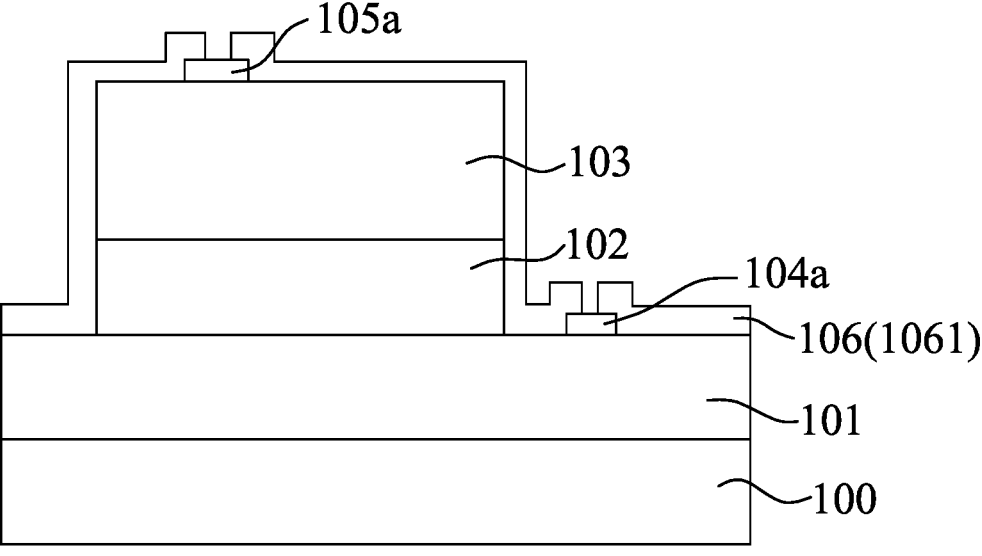

Referring, to FIG. 8, in step (c), a first insulating dielectric layer 106 is formed to cover the first mesa surface (S1) and the second mesa surface (S2). In some embodiments, the first insulating dielectric layer 106 is a distributed Bragg reflector (DBR) with materials of different refractive indices composed in alternating layers. The distributed Bragg reflector may be composed of non-metals such as $SiO_2$, $SiN_x$, $TiO_2$, or $Al_2O_3$. Preferably, the first insulating dielectric layer 106 will have a thickness that is more than 1 μm, and even more preferably the thickness of the first insulating dielectric layer 106 on the first mesa surface (S1) ranges from 1.0 μm to 1.5 μm.

Figure 9:
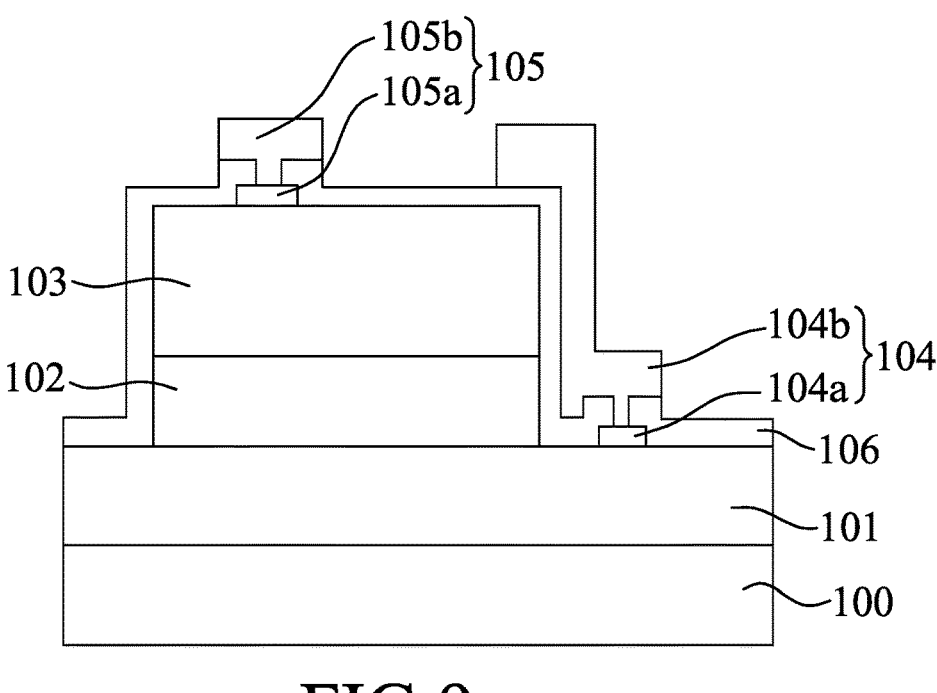

Referring to FIG. 9, in some embodiments, the first insulating dielectric layer 106 has openings formed above the first contact electrode 104a and the second contact electrode 105a, respectively. Next, a first bonding electrode 104b and a second bonding electrode 105b are respectively formed on top of the first contact electrode 104a and the second contact electrode 105a, thereby respectively forming the first electrode 104 and the second electrode 105. The first bonding electrode 104b and the second bonding electrode 105b are respectively and electrically connected to the first contact electrode 104a and the second contact electrode 105a by extending through the openings in the first insulating dielectric layer 106, respectively. In some embodiments, the first bonding electrode 104b extends to the second-type semiconductor layer 103 and is flush with the second bonding electrode 105b.

Figure 10:
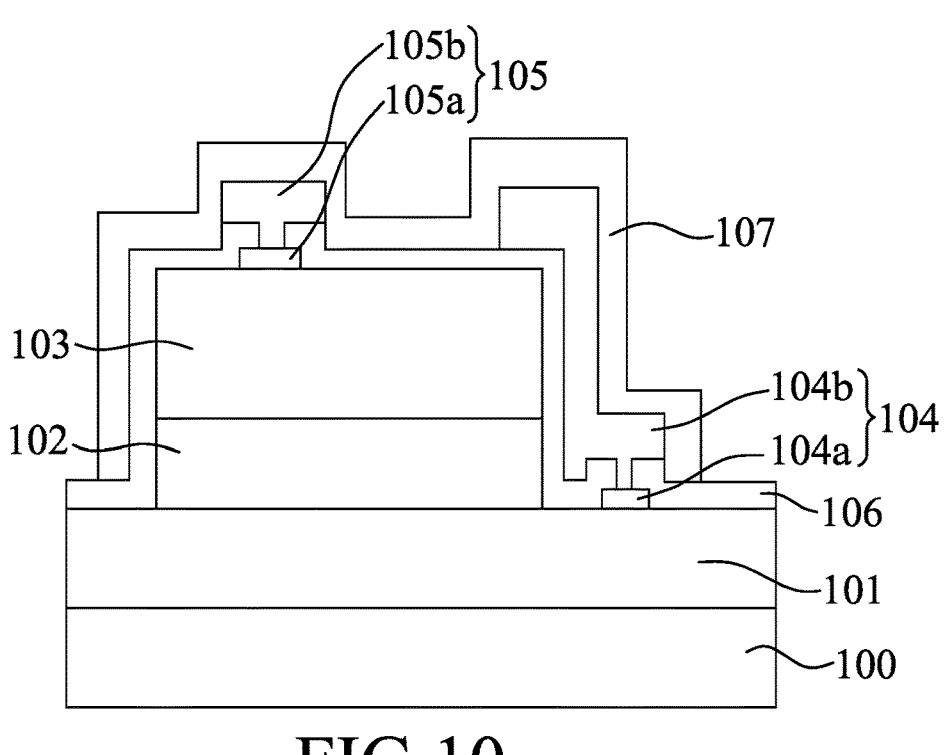

FIG. 10 shows step (d) of the method, wherein the first insulating dielectric layer 106 is covered with a sacrificial layer 107. The sacrificial layer 107 is bonded to a supporting substrate 140, wherein the sacrificial layer 107 forms a bonding connection between each semiconductor structure 10 and the supporting substrate 140. More specifically, the sacrificial layer 107 may be made of an oxide, a nitride, titanium tungsten (TiW), or titanium (Ti), or any other material which is selectively removable from the other layers of the light-emitting assembly. In this embodiment, the sacrificial layer 107 is made of titanium tungsten (TiW) and has a thickness that is greater than 1 μm.

Figure 11:
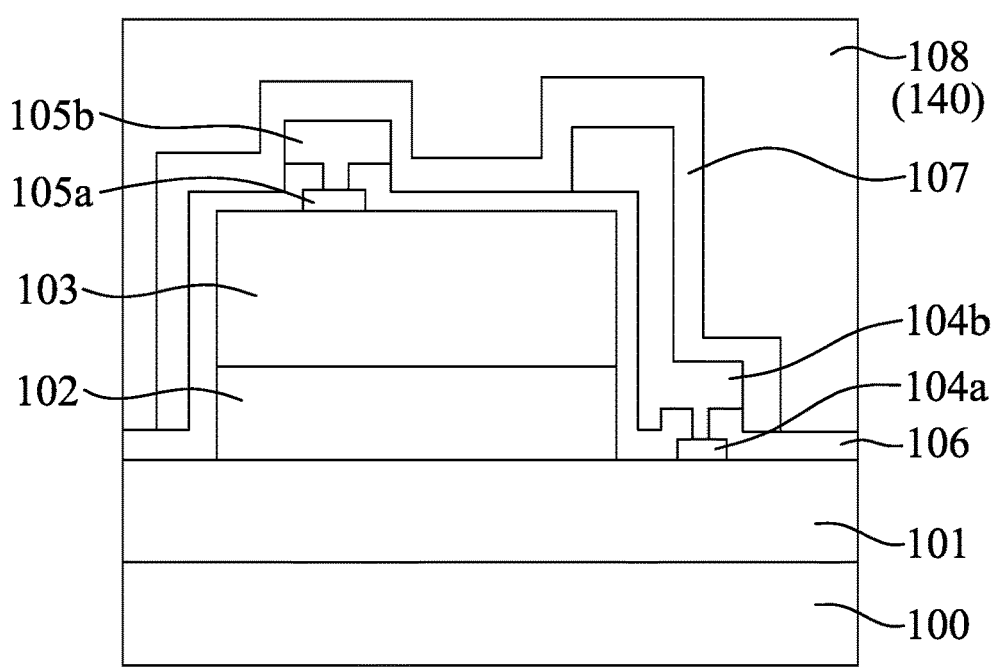

Referring to FIG. 11, the sacrificial layer 107 is covered with a bonding material such as benzocyclobutene (BCB) to form the bonding layer 108.

Figure 12:
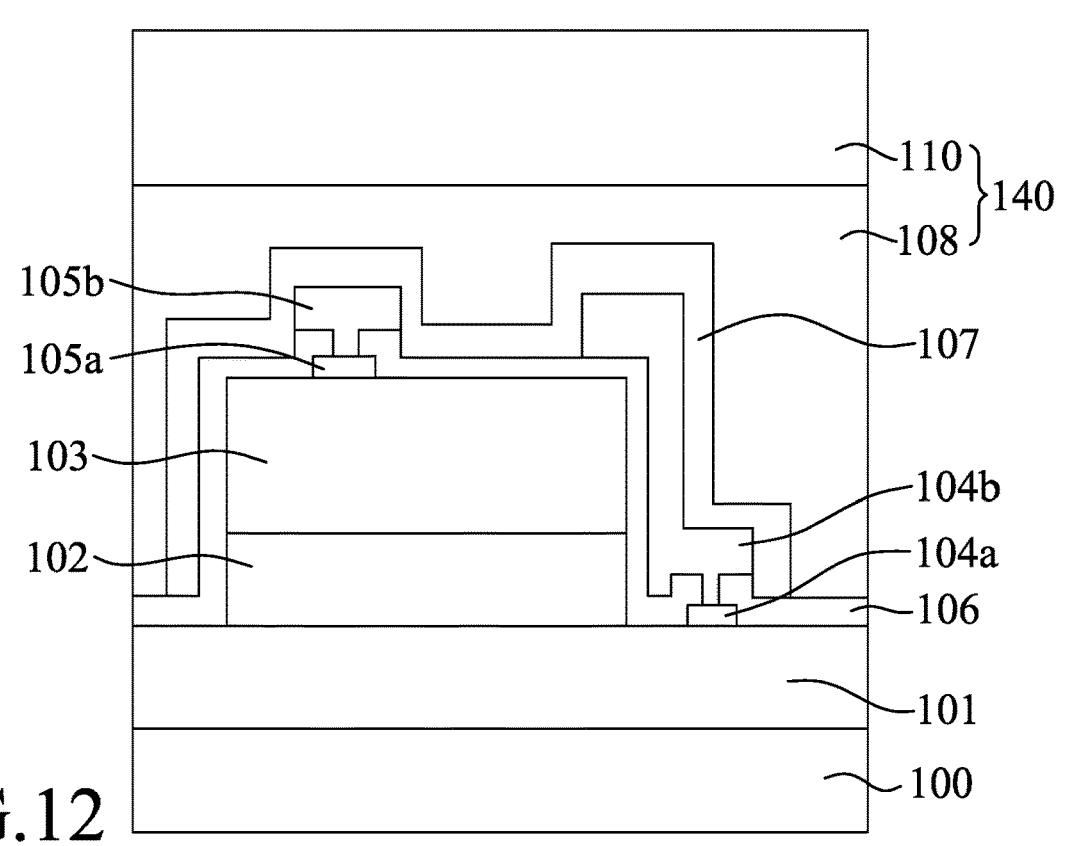

Referring to FIG. 12, the bonding layer 108 is bonded to a base plate 110. The base plate 110 and the bonding layer 108 together form the support substrate 140 that has cavities 120 (only one is shown) for receiving the semiconductor structures 10, respectively.

Figure 13:
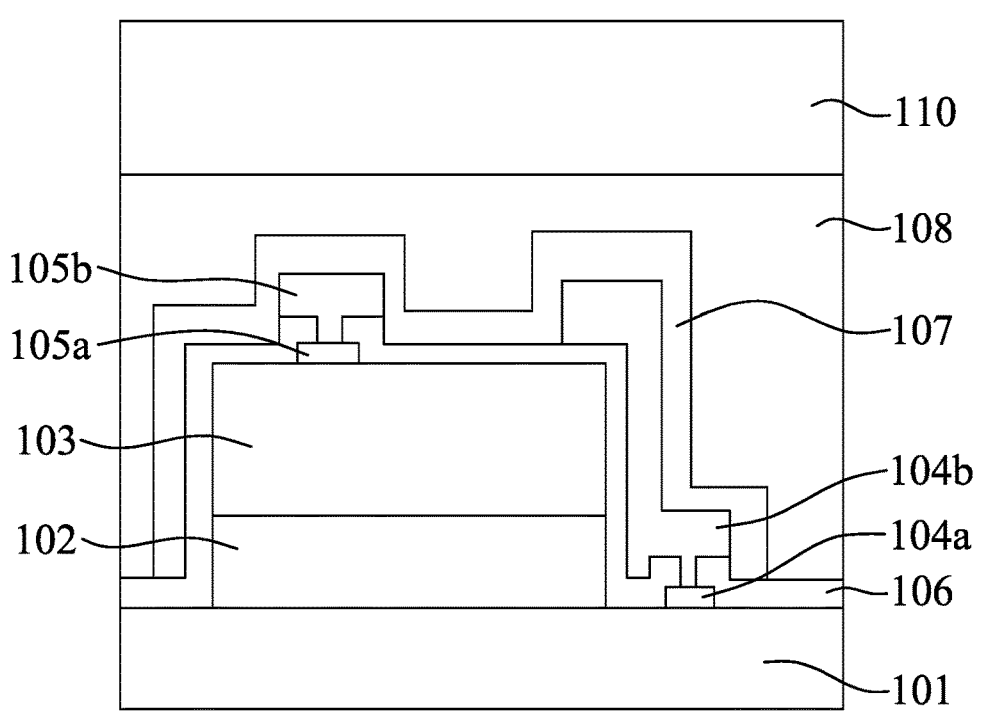

FIG. 13 shows the next step (e) of the method, wherein the whole of the growth substrate 100 is removed and part of the first-type semiconductor layer 101 is removed. More specifically, the growth substrate 100 is stripped off to exposed I a surface of the first-type semiconductor layer 101.

Figure 14:
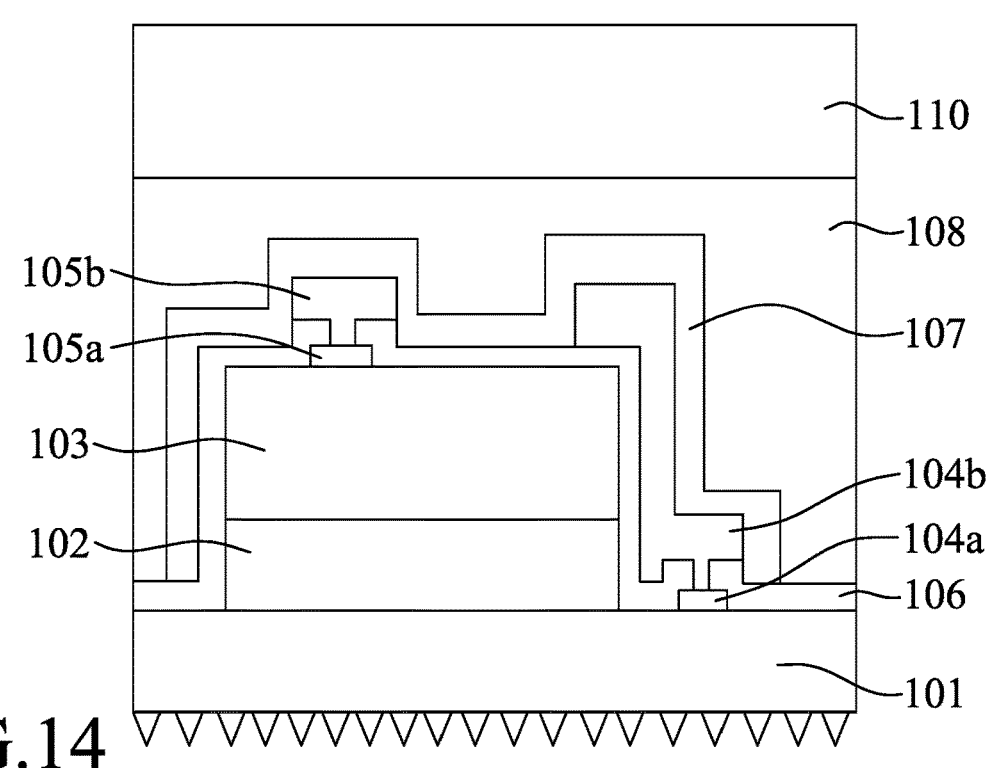

Referring to FIG. 14, the exposed surface of the first-type semiconductor layer 101 that is more distal to the base plate 110 undergoes a roughening procedure to enhance light extraction efficiency.

Figure 15:
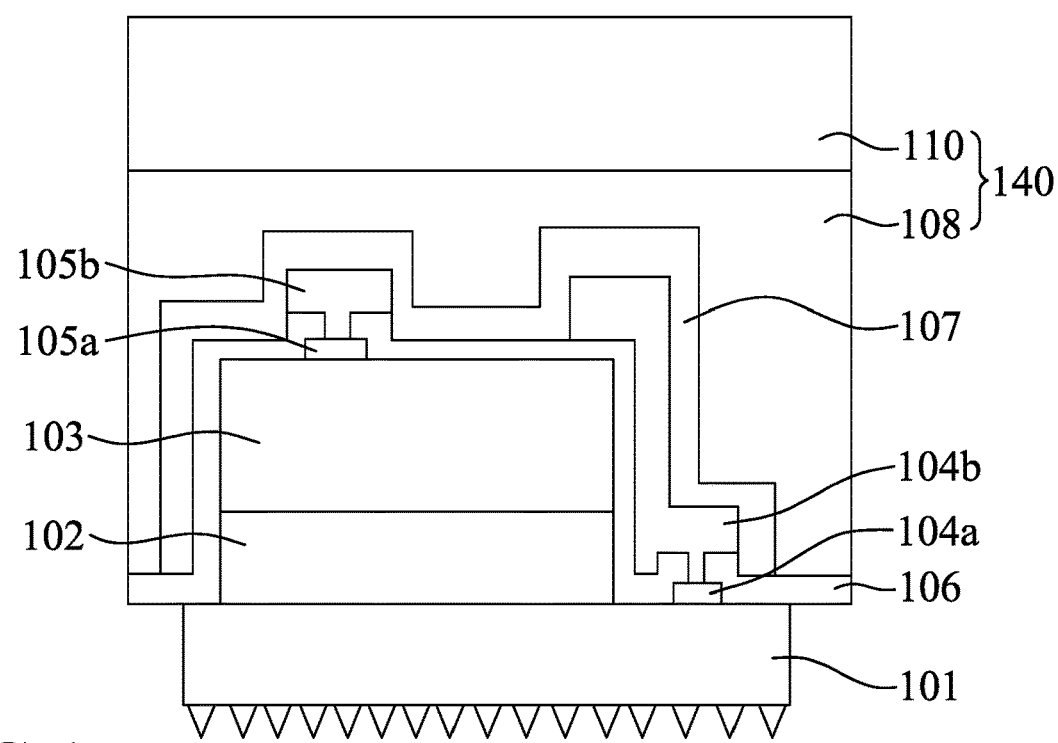

Referring to FIG. 15, a photolithography process and an etching process are performed to remove a border portion of the first-type semiconductor layer 101 in each of the semiconductor structures 10. Etching is stopped at the interface of the first-type semiconductor layer 101 and the first insulating dielectric layer 106. At this state, spacings are created between the semiconductor structures 10.

Subsequently, a step (f) is performed wherein the sacrificial layer 107 is etched away to remove the bonding connection between each semiconductor structure 10 and the support substrate 140. This is followed by forming part of the first insulating dielectric layer 106 into bridging arms 130 such that each of the semiconductor structures has at least two of the bridging arms, wherein the array of the semiconductor structures 10 are formed into an array of separable independent micro LEDs.

Figure 2:
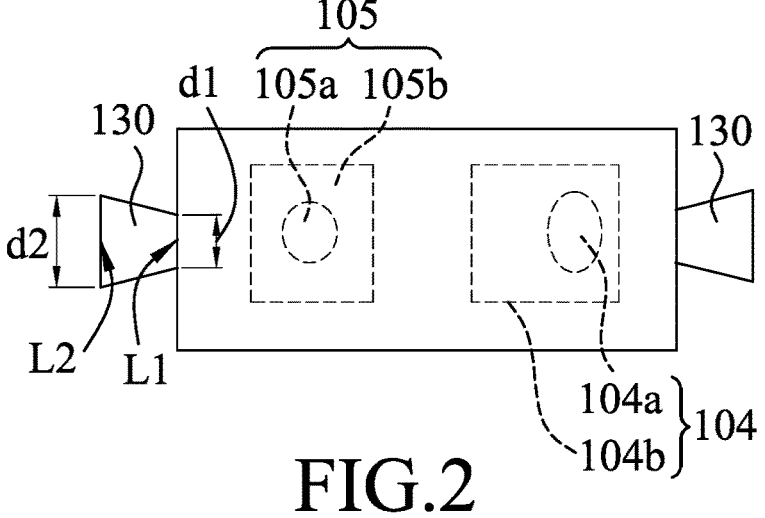
FIG. 2 is a schematic top view illustrating the micro LED of FIG. 1.

The bridging arms 130 are shaped through a patterned photomask, and the bridging arms 130 are thinned using a dry etching process so that the two bridging arms 130 have a thickness that is less than a thickness of a first mesa covering portion 1061 of the insulating dielectric layer 106 that covers the first mesa (S1). In this step the sacrificial layer is etched away so that the micro-LED is suspended. The patterned photomask is used to shape the bridging arms 130 into a trapezoidal shape, and the bridging arms 130 are thinned by dry etching so that the bridging arms 130 are thin and trapezoidal. At this state, each micro-LEDs has a configuration as shown in FIGS. 1 and 2, and the two bridging arms 130 have a thickness that is less than a thickness of a first mesa covering portion 1061 on the that insulating dielectric layer 106 that covers the first mesa (S1).

Figure 16:
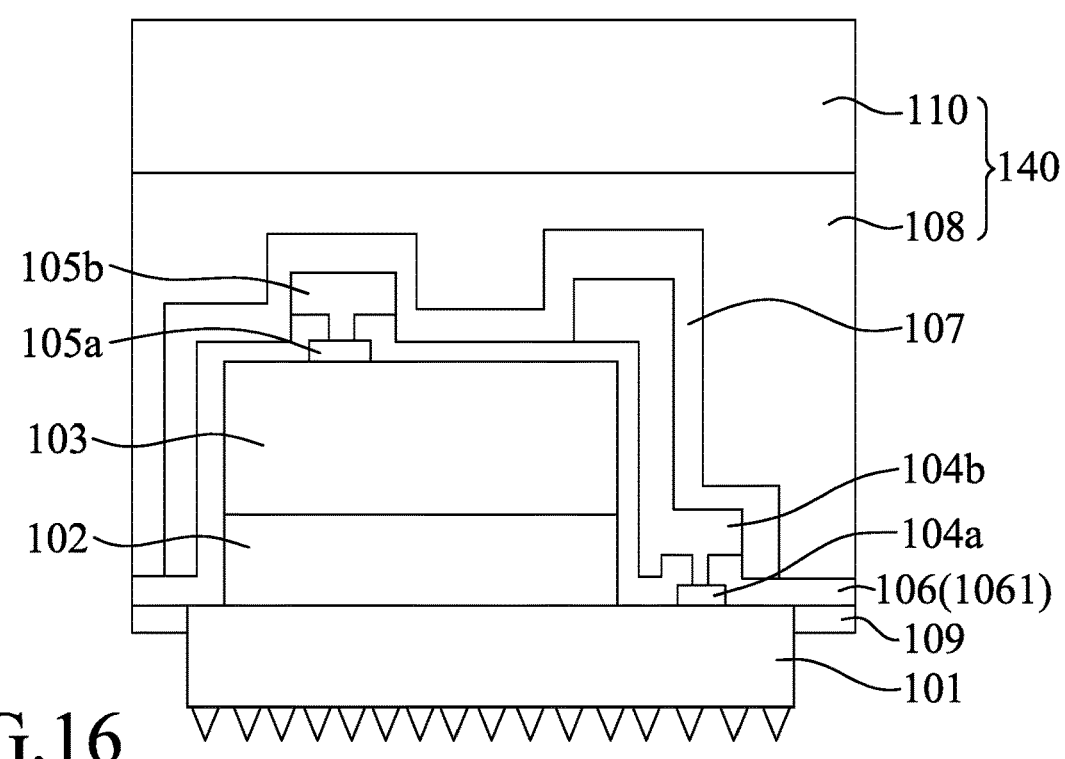

Referring to FIG. 16, in some embodiments, before the sacrificial layer 107 is etched away, a second insulating dielectric layer 109 is formed on a side of the first insulating dielectric layer 106 distal from the base plate 110. The second insulating dielectric layer 109 is formed to strengthen the stability of the first insulating dielectric layer 106, and prevent the bridging arms 130 from breaking when etching away the sacrificial layer 107.

Finally, in a step (g) of the method, the micro-LED is removed from the supporting substrate 140, and the micro-LED is transfer printed to a packaging substrate (not shown in the Figures).

In summary, by virtue of the at least two bridging arms 130 of the first dielectric layer 106 having a thickness which is less than a thickness of the first mesa covering portion 1061 of the first insulating dielectric layer 106 on the first mesa surface (S1), and by having the at least two bridging arms 130 with a trapezoidal shape, each of the two bridging arms 130 has a horizontal cross-section that is parallel to the first mesa surface (S1) and that has an area gradually increasing from the first mesa covering portion 1061 on the first mesa surface (S1) in a direction away from the first mesa covering portion 1061. Therefore, the junctions of the bridging arms 130 with the first mesa covering portion 1061 will have a weakened stress concentrating structure and may form into breakpoints between the first mesa covering portions 1061 and the bridging arms 130. Because the breakpoints may be controlled at the junctions of the bridging arms 130 the problem of variable breakpoints in the prior art which affect the yield of mass transfer can be alleviated.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light emitting assembly comprising:
at least one micro-light-emitting diode (LED) including a semiconductor structure, a first electrode, a second electrode, and a first insulating dielectric layer, said semiconductor structure including a first-type semiconductor layer, a second-type semiconductor layer, and an active layer located between said first-type semiconductor layer and said second-type semiconductor layer, said semiconductor structure having a first mesa surface defined by said first-type semiconductor layer, and a second mesa surface defined by said second-type semiconductor layer, said first electrode being formed on said first mesa surface and electrically connected to said first-type semiconductor layer, said second electrode being formed on said second mesa surface and electrically connected to said second-type semiconductor layer; said first insulating dielectric layer covering said first and second mesa surfaces of said semiconductor structure, and having a first mesa covering portion that covers said first mesa surface, and at least two bridging arms projecting from said first mesa covering portion; and a supporting substrate, said at least one micro-LED being received within said supporting substrate, said at least two bridging arms being respectively located on two opposite sides of said semiconductor structure and connecting said semiconductor structure to said supporting substrate, said at least two bridging arms being bonded to said supporting substrate on said two opposite sides of said semiconductor structure so that said at least one micro-LED is supported by said supporting substrate, said at least two bridging arms having a thickness which is less than a thickness of said first mesa covering portion of said first insulating dielectric layer on said first mesa surface.

2. The light-emitting assembly as claimed in claim 1, wherein said thickness of said at least two bridging arms ranges from 0.5 μm to 1.0 μm less than said thickness of said first mesa covering portion of said first insulating dielectric layer on said first mesa surface.

3. The light-emitting assembly as claimed in claim 1, wherein said thickness of said at least two bridging arms ranges from 0.5 μm to 1.0 μm.

4. The light-emitting assembly as claimed in claim 1, wherein said thickness of said first insulating dielectric layer on said first mesa surface ranges from 1 μm to 1.5 μm.

5. The light-emitting assembly as claimed in claim 1, wherein each of said two bridging arms has a horizontal cross-section that is parallel to a surface of said first mesa surface, and that has a trapezoidal shape.

6. The light-emitting assembly as claimed in claim 5, wherein each of said two bridging arms has a horizontal cross-section that is parallel to said first mesa surface and that has an area gradually increasing from said first mesa covering portion of said first mesa surface in a direction away from said first mesa covering portion.

7. The light-emitting assembly as claimed in claim 5, wherein each of said horizontal cross-sections of said at least two bridging arms has a long side and a short side that are parallel, and a ratio between lengths of said long side and said short side ranges from 1.5 to 3.

8. The light-emitting assembly as claimed in claim 7, wherein said short side of each of said at least two bridging arms forms a junction with said first mesa covering portion of said first insulating dielectric layer.

9. The light-emitting assembly as claimed in claim 8, wherein said micro-LED has a length dimension, a width dimension, and a height dimension, and said length, width and height dimensions each ranges from 2 μm to 100 μm.

10. The light-emitting assembly as claimed in claim 1, wherein said first insulating dielectric layer is a distributed Bragg reflector (DBR).

11. The light-emitting assembly as claimed in claim 1, wherein said supporting substrate includes a base plate, and a bonding layer that is located above said base plate, said at least two bridging arms and said semiconductor structure straddling said bonding layer.

12. The light-emitting assembly as claimed in claim 11, wherein said bonding layer is made of a material that includes a benzocyclobutene (BCB) adhesive, silica gel, a UV adhesive, or a resin adhesive.

13. The light-emitting assembly as claimed in claim 1, wherein said at least two bridging arms are made of a material that includes $SiO_2$, $SiN_x$, $TiO_2$, $Al_2O_3$ or any combination of the above.

14. The light-emitting assembly as claimed in claim 1, wherein said micro-LED is a flip-chip package.

15. The light-emitting assembly as claimed in claim 1, wherein said supporting substrate has a cavity receiving said micro-LED, and a sacrificial layer disposed in said cavity around said micro-LED.

16. The light-emitting assembly as claimed in claim 15, wherein said sacrificial layer includes a material that includes an oxide, a nitride, titanium (Ti), titanium tungsten (TiW) or any combination of the above.

17. The light-emitting assembly as claimed in claim 15, wherein said sacrificial layer has a thickness that is greater than 1 μm.

18. A micro-LED device comprising:

a chip formed from said at least one micro-LED of the light-emitting assembly of claim 1 by separating said at least one micro-LED from said supporting substrate of the light-emitting assembly, a side wall of said chip having a residual part of at least one of said two bridging arms that is in a small quantity.

19. The micro-LED device as claimed in claim 18, wherein said residual part of said at least one of said two bridging arms has a width that ranges from 0.5 to 1.0 μm.

20. A method of manufacturing and transfer printing micro-LEDs to a semiconductor packaging board comprising the steps of:

(a) forming on a growth substrate a semiconductor stack that includes a first-type semiconductor layer, a second-type semiconductor layer, and an active layer located between the first-type semiconductor layer and the second-type semiconductor layer;

(b) removing partially the semiconductor stack to form an array of semiconductor structures each having a first mesa surface and a second mesa surface that are respectively defined by the first-type semiconductor layer and the second-type semiconductor layer, and forming a first electrode and a second electrode on the first mesa and the second mesa, respectively;

(c) forming a first insulating dielectric layer to cover the first mesa surface and the second mesa surface of each of the semiconductor structures;

(d) covering the first insulating dielectric layer with a sacrificial layer, and bonding the sacrificial layer to a supporting substrate, wherein the sacrificial layer forms a removable bonding connection between each of the semiconductor structures and the supporting substrate;

(e) removing a whole of the growth substrate and part of the first type semiconductor layer so that spacings are created between the semiconductor structures;

(f) etching away the sacrificial layer to disconnect each of the semiconductor structures from the supporting substrate, followed by forming part of the first insulating dielectric layer into bridging arms such that each of the semiconductor structures has at least two of the bridging arms, wherein the bridging arms are shaped through a patterned photomask, the bridging arms are thinned using a dry etching process so that the bridging arms have a thickness that is less than a thickness of a first mesa covering portion of the first insulating dielectric layer that covers the first mesa surfaces, and the array of the semiconductor structures are formed into an array of separable independent micro LEDs;

(g) removing the micro-LEDs from the supporting substrate, and transfer printing the micro-LEDs to a packaging substrate.

\* \* \* \* \*